United States Patent [19]
Francis

[11] Patent Number: 5,212,414
[45] Date of Patent: May 18, 1993

[54] SWITCH WITH FREQUENCY COMPENSATION, DIFFERENTIAL BIAS OPERATION COMPENSATION AND ENABLE INDICATOR

[75] Inventor: John R. Francis, Burlington, Canada

[73] Assignee: Gennum Corporation, Burlington, Canada

[21] Appl. No.: 589,229

[22] Filed: Sep. 26, 1990

[30] Foreign Application Priority Data

Oct. 13, 1989 [CA] Canada .................................. 2000636

[51] Int. Cl.$^5$ ...................... G06G 7/12; H03K 17/56; H03K 17/60; H03K 3/01
[52] U.S. Cl. .................................... 307/491; 307/241; 307/254; 307/270; 307/494
[58] Field of Search ............... 307/491, 493, 241, 542, 307/544, 552, 270, 254

[56] References Cited

U.S. PATENT DOCUMENTS

| | | |
|---|---|---|
| 4,663,598 | 5/1987 | Dayton et al. . |
| 4,684,823 | 8/1987 | Dayton et al. . |
| 5,023,476 | 6/1991 | Watanabe et al. .................. 307/491 |
| 5,028,815 | 7/1991 | Van De Plassche ............... 307/491 |
| 5,047,727 | 9/1991 | Theus ................... 307/491 |
| 5,087,831 | 2/1992 | Ten Eyck ............................ 307/491 |

Primary Examiner—William L. Sikes
Assistant Examiner—Trong Quang Phan
Attorney, Agent, or Firm—Bereskin & Parr

[57] ABSTRACT

The switch has a cross-point. The cross-point has an input buffer, a level shift and an output buffer. The input and output buffers are BJT's, the level shift is two diode connected BJT's. The voltage drops across the buffers are designed to match the voltage drops across the diodes. The cross-point is enabled by a current source forcing current through the diodes. The matching of the voltage drops is effected by the Early voltage of the BJT's as they are operated at different $V_{ce}$'s. An Early voltage determinator determines the effect of the Early voltage and adjusts the current flowing from the current source to force differing bias currents through the input buffer and the diodes to make the sum of the $V_{be}$'s of each more independent of Early voltage. The output impedance of the current source and the impedance of the cross-point form a resistor-capacitor network. Where the $f_T$ of the current source is sufficiently low, the network has a pole-zero combination within the otherwise usable bandwidth of the switch. The current source has a first BJT at its output. A frequency compensating BJT is connected to the base of the first BJT, bringing the pole and zero closer together and shifting the pole-zero combination towards the upper limit of the otherwise usable bandwidth of the switch. A tally output is provided from the biasing network of the switch. The tally output provides an indication of the operating state,

14 Claims, 5 Drawing Sheets

SWITCH WITH FREQUENCY COMPENSATION, DIFFERENTIAL BIAS OPERATION COMPENSATION AND ENABLE INDICATOR

FIELD OF THE INVENTION

This invention relates to electronic switches. In at least one of its aspects it relates more particularly to electronic switches for broadband applications.

BACKGROUND OF THE INVENTION

As electronic applications become increasingly complex great demands are placed on the switches used therein. In the past relays were employed for switching applications. Monolithic switches replaced relays, increasing the number of frequencies within which the switches have a substantially constant gain. These frequencies make up the usable bandwidth of the switch. In order to increase the bandwidth further and to decrease the operating voltage of the monolithic switches, finer manufacturing processes are being used.

The upper limit of the bandwidth of switches increases as the process used becomes more fine. However, many switches require a current source feeding into the signal path. This current source must have a high impedance so as not to degrade the signal in the signal path. A resistor would not be employed as the current source for demanding applications as it would cause distortion. An active component must be used. This introduces a resistor-capacitor network having a pole-zero combination. To keep the pole-zero combination above the otherwise usable bandwidth, a high impedance, high unity gain frequency, $f_T$, transistor may be employed as the current source. However, these transistors are expensive to manufacture.

Another problem encountered with some switches results from employing bipolar junction transistors for which it is desirable that the base-emitter voltages, $V_{BE}$'s, be substantially similar while the collector-emitter voltages ($V_{CE}$'s) of those transistors are substantially dissimilar. What constitutes substantial similarity and dissimilarity will depend on the tolerance specifications of the DC offset of the switch. Typical matching techniques for producing substantially similar $V_{BE}$'s employ substantially similar currents flowing in the collectors of each transistor. However, where the transistors are operated at substantially dissimilar $V_{CE}$'s, the $V_{BE}$'s will not necessarily be the same due to base-width modulation effects. The Early voltage, $V_A$, of the transistors is a measure of these effects. The Early voltage of a transistor is not easily controllable during the manufacturing process, becoming lower, therefore having more effect, as the process becomes increasingly fine. Variations in the Early voltage result in unpredictable values of output offset for the switch. The output offset is the DC voltage difference between the input and the output of the switch. This limits the applications where the switch may be used.

Furthermore, it is sometimes required to indicate when a monolithic switch is on. Typically indications are given of when a particular switch has been selected for operation, i.e. enabled, however this indication only represents a selection of a particular switch or the state of the control logic. It does not represent the actual functioning of the switch once enabled.

SUMMARY OF THE INVENTION

In a first aspect the invention provides a switch for switching an input signal at an input to an output signal at an output, said switch being operable in an enabled state and in a disabled state, said switch comprising: (a) cross-point switching means for switching the input signal to the output signal; (b) switching control means coupled to said cross-point switching means, said switching control means having an enable input for receiving an enable signal and means for switching the input signal to the output signal in response to said enable signal; and (c) compensation means for controlling an Early voltage effect in said cross-point switching means, said compensation means being coupled to said switching control means; (d) said cross-point switching means comprising an input buffer coupled to said input, and output buffer coupled to said output, and level shifting means coupling said input buffer to said output buffer, said level shifting means being coupled to said switching control means, and said level shifting means being responsive to operation of said switching control means for said level shifting means to switch the input signal coupled to said input buffer to said output buffer in response to receipt of said enable signal at said enable input.

In a second aspect the invention provides a switch for switching an input signal to an output signal, said switch being operable over a frequency response range and said switch being operable in an enabled state and a disabled state, said switch comprising: (a) cross-point switching means for switching the input signal to the output signal; (b) switching control means coupled to said cross-point switching means, said switching control means having an enable input for receiving an enable signal and means for switching the input signal to the output signal in response to said enable signal; (c) compensation means for controlling an Early voltage effect in said cross-point switching means, said compensation means being coupled to said switching control means; (d) switch state indicating means for indicating when said switch is in the enabled state and when said switch is in the disabled state, said switch indicating means being coupled to said compensation means; and (e) frequency response control means for controlling the frequency response of said switch, said frequency response control means being coupled to said switching control means.

BRIEF DESCRIPTION OF THE DRAWINGS

For a better understanding of the present invention, and to show more clearly how it may be carried into effect, reference will now be made, by way of example to the accompanying drawings, which show a preferred embodiment of the present invention, and in which.

DETAILED DESCRIPTION OF THE PREFERRED EMBODIMENT

Figure 1:
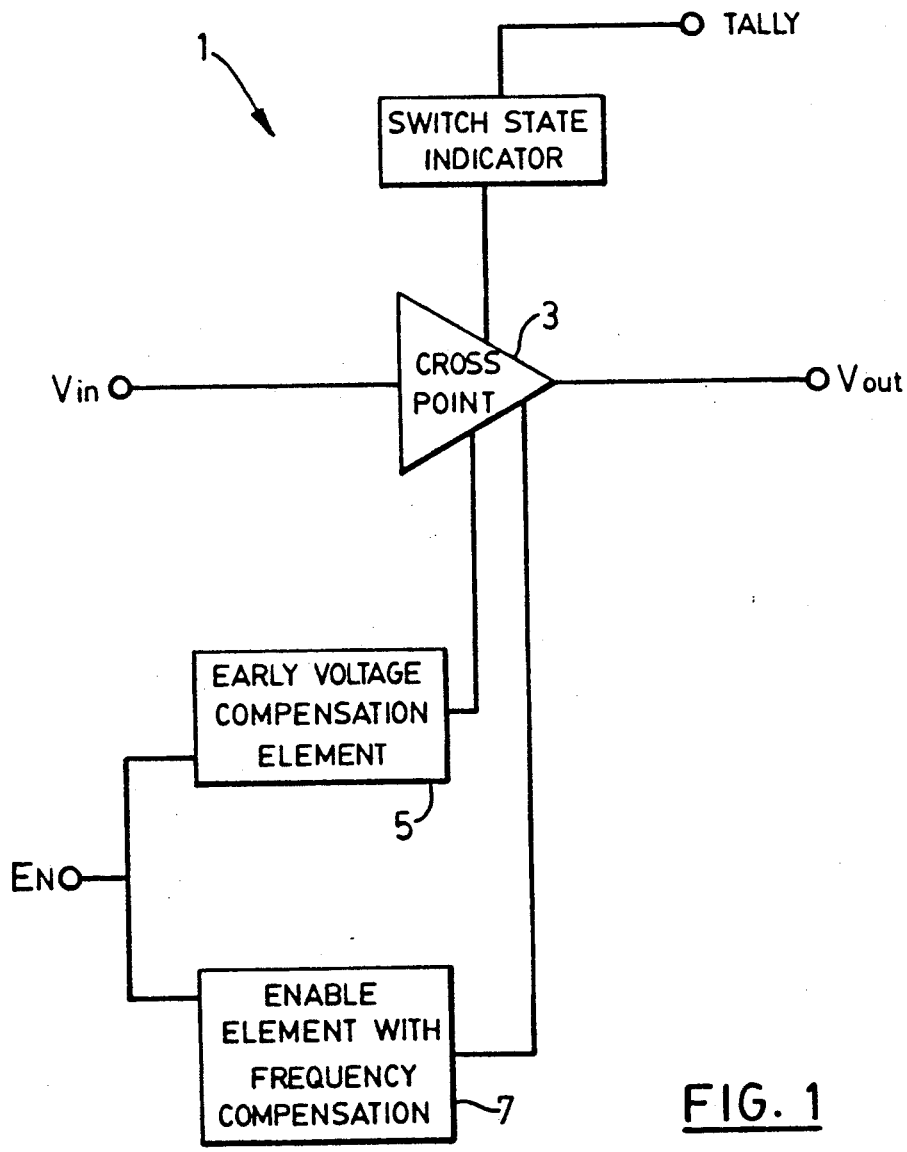
FIG. 1 is a block diagram of a switch according to the preferred embodiment of the present invention.

Referring to FIG. 1, a switch 1 has a cross-point gate 3. The cross-point 3 has an input $V_{in}$ and an output $V_{out}$. The cross-point 3 is also connected, through an Early voltage compensation element 5 and through an enable element with frequency compensation 7, to an enable input EN. The cross-point is further connected to a switch state indicator 9 to an output TALLY.

In operation, an enable signal is received at EN. The signal is passed through the element 7 to the cross-point 3. The cross-point 3 is enabled, passing a signal at $V_{in}$ to $V_{out}$. The output offset of the switch is determined by $V_{out} - V_{in}$. When the EN signal is low, the cross-point 3 is disabled. $V_{out}$ is isolated from $V_{in}$.

The element 9 determines the operating state of the cross-point 3, either enabled or disabled. The state is output at TALLY.

The element 5 determines the effect of the Early voltage on the bi-polar junction transistors (BJT's), not shown in FIG. 1, in the cross-point 3 which are for operation at substantially similar $V_{BE}$'s and substantially dissimilar $V_{CE}$'s. As will be discussed later, the element 5 contains a substantially equivalent DC circuit to the BJT's for operation at similar $V_{BE}$'s. The element 5 sets the bias conditions of the BJT's to compensate for the effect of the Early voltage. It is assumed that the Early voltage of each BJT is the same as this technique is primarily designed for use in monolithic switches 1. However, even in a monolithic switch 1, the Early voltages of the BJT's may differ by 10 to 15%. This will effect the accuracy of the compensation. The compensation will, however, be an improvement upon an uncompensated switch.

Figure 2:
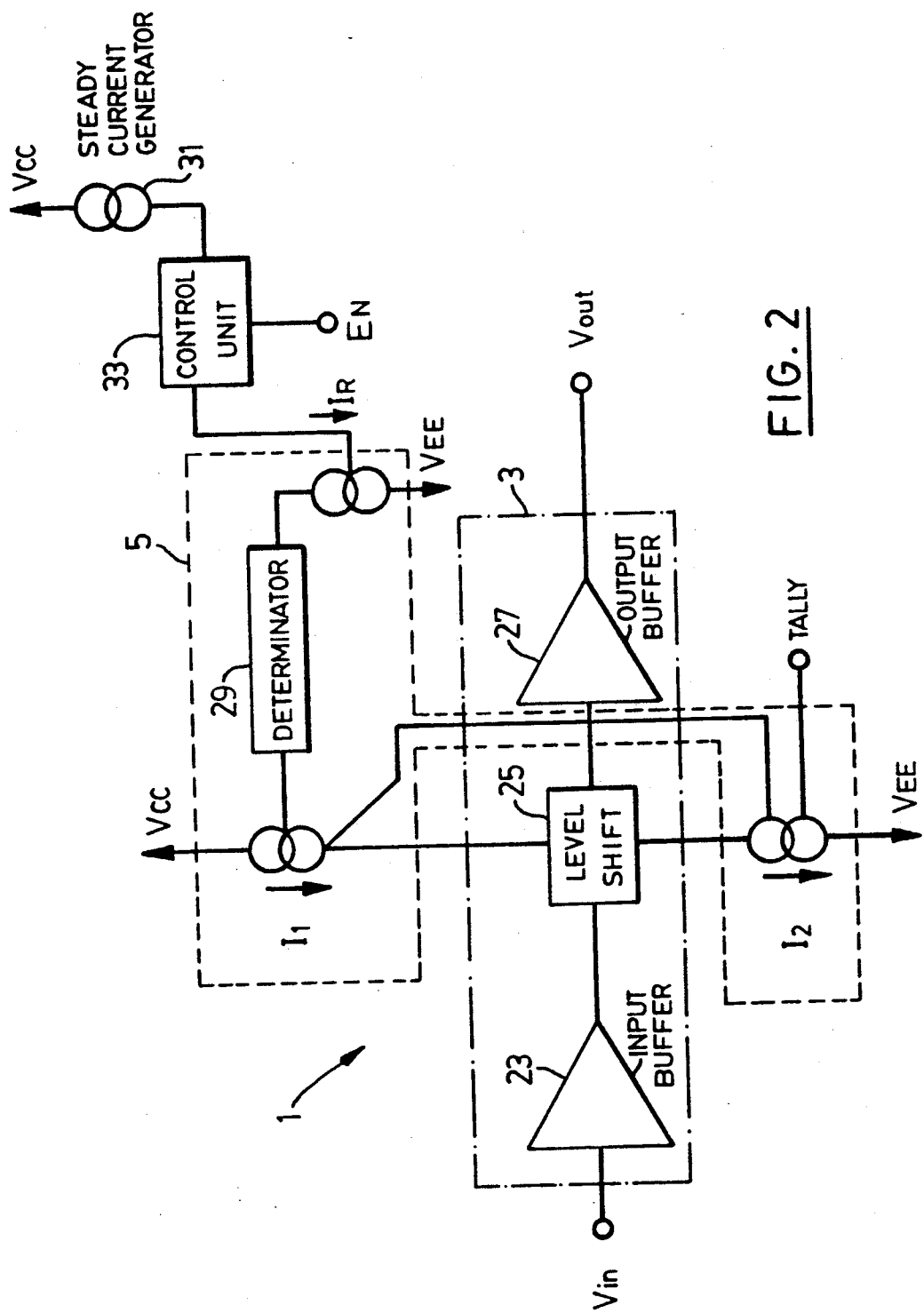
FIG. 2 is a detailed block diagram of the switch of FIG. 1.

As shown in FIG. 2, the element 7 has a switchable current source with frequency compensation $I_1$. The current source $I_1$ has an active component as shown by BJT $Q_{102}$ of FIG. 3. The output impedance of current source $I_1$ must be high so as not to degrade the signal passing through the input buffer 23 and level shift 25 from $V_{in}$ to $V_{out}$. A resistor cannot be used for the current source $I_1$ as a resistor would not be a high enough impedance. $Q_{102}$ is in part equivalent to a resistor and capacitor in series, creating a resistor-capacitor, RC, network including the source resistance of the cross-point 3 and the output impedance of the element 7. This network will have at least one pole and zero. With a BJT $Q_{102}$ of sufficiently high output impedance and unity gain frequency, $f_T$, the pole and zero will be above the bandwidth of the switch 1. However, such a BJT is relatively difficult and expensive to manufacture. Accordingly, the element 7 employs current source $I_1$ with a high impedance transistor $Q_{102}$ having a lower radian frequency $f_T$, and with frequency compensation.

Without frequency compensation, the lower $f_T$ can create a pole-zero combination in the otherwise usable bandwidth of a switch, not shown. As is known, the pole-zero combination produces a dip in the frequency response of the switch. The frequency compensation of the switch 1 brings the pole and zero closer together decreasing the amplitude of the dip. The frequency compensation also shifts the pole-zero combination toward or above the otherwise upper limit of the bandwidth of the switch 1.

As the element 5 is also in contact with the signal passing from $V_{in}$ to $V_{out}$, the element 5 will require similar frequency compensation to the element 7. The switch 1 is less complex when the elements 5,7 are combined, and connected to create a series rather a parallel path. The rest of this disclosure will describe a switch 1 where elements 5, 7 are so combined. The components of each element 5, 7 will be described where they can be broken down. It is to be understood that it is not necessary in all applications to combine the elements 5,7 nor is it always necessary to use both elements 5,7.

Referring to FIG. 2, the cross-point 3 has an input buffer 23, a level shift 25 and an output buffer 27. The element 5 is made up of a determinator 29, a current source with frequency compensation $I_1$ and a current sink $I_2$. The element 7 includes a steady current generator 31, an enable control unit 33, a switchable current reference $I_R$, the current source $I_1$ and the current sink $I_2$. The element 9, strictly speaking, includes each of the components of the elements 5,7 and particularly the current sink Iz. The elements 5,7,9 together make up a biasing network of the switch 1.

The unit 33 is connected to EN.

The unit 33 is kept biased by the generator 31. The unit 33 controls the reference $I_R$. The reference $I_R$ is connected through the determinator 29 to a control input of the source $I_1$. The source $I_1$ is connected to the cross-point 3 at the level shift 25. The current sink $I_2$ is connected directly to the level shift 25, and from the current source $I_1$ to a control input of the current sink $I_2$.

In operation, the switch 1 receives an input signal at $V_{in}$ and an enable signal at EN. When the enable signal is enabled, the unit 33 draws operating current from the generator 31 to switch on the current reference $I_R$. The reference $I_R$ drives the determinator 29 to determine the effects of the Early voltage on the cross-point 3. The determinator 29 is a substantially equivalent DC circuit to the buffer 23 and level shift 25.

The determinator 29 activates the current source $I_1$ to enable the level shift 25 and the current source $I_2$ and, correspondingly, the cross-point 3.

The input signal at $V_{in}$ flows from $V_{in}$ through the buffer 23, level shift 25 and buffer 27. The level shift 25 compensates for the voltage drops in both buffers 23, 27.

Figure 3:
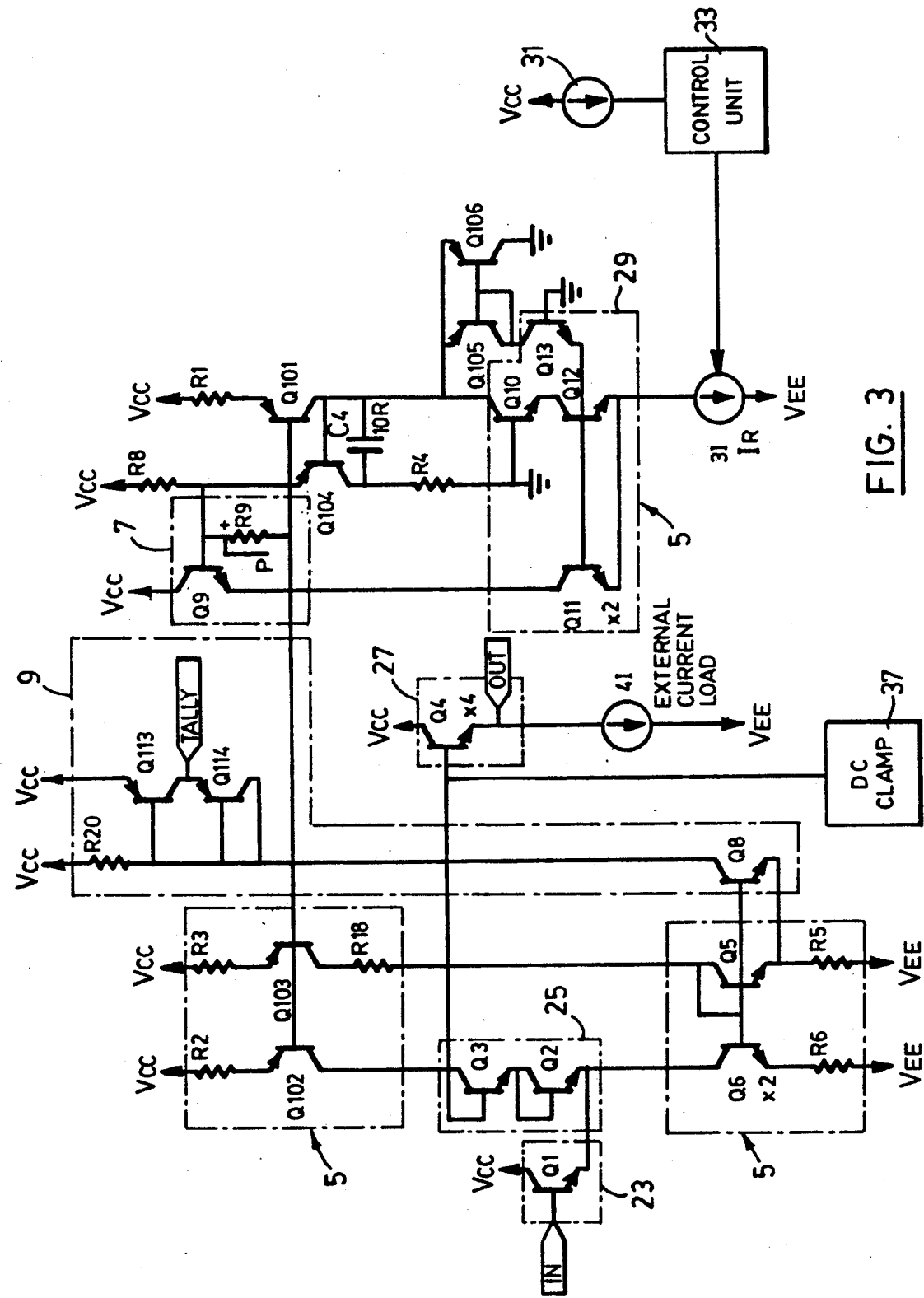
FIG. 3 is a partial circuit diagram and block diagram of the switch of FIG. 1.

For a more reproducible output offset, the voltage rises in the level shift 25 and drops in the buffers 23, 27 should be matched so that the output offset of the cross-point 3 will be independent of the Early voltage of components employed in the cross-point 3. In the Figures, it is convenient to denote the emitter area of a bi-polar junction transistor in a current mirror using "x2" notation. This notation means that the emitter area of the transistor is twice the emitter area of the other transistor in the current mirror. As shown in FIG. 3, the buffers 23, 27 may be BJT's, $Q_1$, $Q_4$, while the level shift 25 may be two diode connected BJT s, $Q_2$, $Q_3$. For optimum operation, $V_{BE1}$ should be identical to $V_{BE2}$ and $V_{BE3}$ should be identical to $V_{BE4}$. Typical, biasing circuits call for the current in the emitters, $I_E$, and the collectors, $I_c$, of each transistor to be the same for the $V_{BE}$'s to be the same. However, the Early voltage will cause the $V_{BE}$'s to be different. The determinator 29 determines the approximate effect on the $V_{BE}$'s of $Q_1$, $Q_3$, and $Q_4$ when operating at differing $V_{CE}$'s. This effect is passed to $I_1$ which generates a current having two component: I independent of the Early voltage and equal to the bias current at which $Q_1$ is to operate, and $I_V$ dependent on the Early voltage and representative of the effect on the $V_{BE}$'s of $Q_1$, $Q_2$. $I_1$ being I minus $I_V$. The level shift 25 and $I_2$ receive the current $I_1$. $I_2$ sinks a current equal to $2I - I_V$. Thus, I must be flowing from the emitter of $Q_1$. $V_{BE1}$ and $V_{BE2}$ will be matched. Also $V_{BE3}$ and $V_{BE4}$ will be matched. $V_{BE3}$ will be the same as $V_{BE2}$. The collector-emitter voltage of $Q_4$ is approximately the same as that of $Q_1$, thus $V_{BE4}$ is approximately the same as $V_{BE1}$.

The output impedance of $I_1$ combined with the resistances of the buffer 23 and level shift 25 create an RC network. The network produces a pole and zero. The frequency compensation in $I_1$ brings the pole and zero closer together to reduce the amplitude of the dip. The frequency compensation additionally shifts the pole-zero towards or above the otherwise usable bandwidth of switch 1.

EARLY VOLTAGE COMPENSATION

As discussed above, the switch 1 includes a level shifter 25 which uses two diode-connected transistor $Q_2$ and 3 to compensate for the voltage drops (i.e. $V_{BE}$) across the emitter-base junctions of $Q_1$ and $Q_4$. For optimum operation of the switch 1, the voltage drops across the emitter-base junctions of $Q_1$, $Q_2$, $Q_3$ and $Q_4$ should be matched, however, the Early voltage effect will tend to vary these voltage drops. Accordingly, the present invention includes Early voltage compensation in the determinator 29. As was explained, the compensation comprises biasing the transistor with a current source having two components: I and $I_V$. The current component I is independent of the Early voltage, while the other current component $I_V$ is a function of the Early voltage. The compensation of the Early voltage by I and $I_V$ can be shown by considering $V_{BE1} = V_{BE2}$ (i.e. $Q_1$ and $Q_2$) in terms of the well-known equation for the Early voltage effect.

Substituting the classic equation for the Early Voltage, $V_A$, the expression $V_{BE1} = V_{BE2}$ can be expressed as follows:

$$V_T \ln \frac{I_{c1}}{I_s(1 + V_{CE1}/V_A)} + R_{B1} I_{B1} =$$

$$V_T \ln \frac{I_{c2}}{I_s(1 + V_{CE2}/V_A)} + R_{B2} I_{B2}$$

where
 $I_B$ is the base current
 $I_C$ is the collector current
 $R_B$ is the base resistance
 $I_S$ is the saturation current
 $V_T$ is the thermal voltage $$I_{C2} = I_{C1} \frac{V_A + V_{CE2}}{V_A + V_{CE1}} \exp\left(\frac{I_{B1} R_{B1} - I_{B2} R_{B2}}{V_T}\right)$$

The exponent will be approximately unity and is neglected.

$$\frac{I_{C2}}{I_{C1}} \approx \frac{V_A + V_{CE2}}{V_A + V_{CE1}}$$

Referring to FIG. 2, the provide Early voltage compensation, the current source $I_1$ (shown as $Q_{102}$ in FIG. 3) supplies a current consisting of I and $I_V$, and the current sink $I_2$ (shown as $Q_6$ in FIG. 3) sinks the current from the emitters of $Q_1$ and $Q_2$. Referring to FIG. 3, $I_1 = I = I_V$ is flowing in the emitter of $Q_2$, while I is flowing in the emitter of $Q_1$. Then for $Q_2$ and $Q_1$ respectively, $$I - I_V = I_{C2} + I_{B2} \quad I - I_{B1} = I_{C1}$$

which can be substituted for $I_{C1}$ and $I_{C2}$ in the above expression to give the following.

$$\frac{I - I_V - I_{B2}}{I - I_{B1}} = \frac{V_A + V_{CE2}}{V_A + V_{CE1}}$$

$$I - I_V = \frac{V_A + V_{CE2}}{V_A + V_{CE1}} (I - I_{B1}) + I_{B2}$$

$$I_V = \left(1 - \frac{V_A + V_{CE2}}{V_A + V_{CE1}}\right)I - I_{B2} + \left(\frac{V_A + V_{CE2}}{V_A + V_{CE1}}\right)I_{B1}$$

Figure 4:
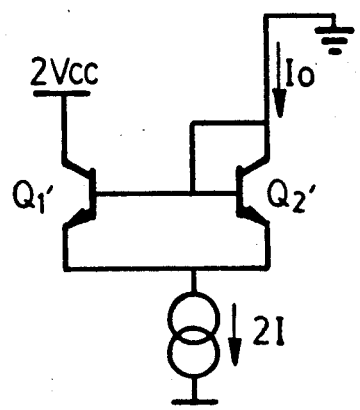
FIG. 4 is a circuit diagram of a determinator.

Using the well-known Kirchoff voltage Law, the voltages $V_{CE1}$ and $V_{CE2}$ can be expressed in terms of the supply voltage $V_{CC}$ n the base-emitter voltage $V_{BE}$ as follows: $V_{CE1} = V_{BE} + V_{CC}$ and $V_{CE2} = V_{BE}$. Substituting into the above expression gives the following:

∴ according to the above, the current source $$I_1 \text{ requires } \left(\frac{V_A + V_{BE}}{V_A + V_{BE} + V_{CC}}\right)I +$$

$$I_{B2} - \left(\frac{V_A + V_{BE}}{V_A + V_{BE} + V_{CC}}\right)I_{B1}$$

and the current sink $I_2$ requires $\left(\frac{2V_A + V_{CC} + V_{BE}}{V_A + V_{BE} + V_{CC}}\right)I +$ $$I_{B2} - \left(\frac{V_A + V_{BE}}{V_A + V_{BE} + V_{CC}}\right)I_{B1}$$

the current components, i.e. I and $I_V$, of the current source $I_1$ can be generated using the circuit shown in FIG. 4. This circuit is an equivalent DC circuit to $Q_1$ and $Q_2$ and for notional convenience the transistors will be reference as $Q_1'$ and $Q_2'$, and the double supply voltage $V_{CC}$ will be designated as 2 $V_{CC}$.

Again considering the voltage drops across the emitter-base junctions for $Q_1'$ and $Q_2'$, i.e. $V_{BE1}' = V_{BE2}'$ and substituting the classic equation for Early voltage, the expression for $V_{BE1}' = V_{BE2}'$ becomes:

$$\therefore V_T \ln \frac{I_{C1}'}{I_S\left(1 + \frac{V_{CE1}'}{V_A}\right)} + I_{B1}' R_{B1}' =$$

$$V_T \ln \frac{I_{C2}'}{I_S\left(1 + \frac{V_{CE2}'}{V_A}\right)} + I_{B2}' R_{B2}'$$

$$\frac{I_{C2}'}{I_{C1}'} \approx \frac{V_A + V_{CE2}'}{V_A + V_{CE1}'} \approx \frac{V_A + V_{BE2}}{V_A + 2V_{CC} + V_{BE1}}$$

Applying the well-known Kirchoff Current Law to the circuit in FIG. 4, the collector current $I_{C1}'$ for $Q_1'$ can be expressed as follows:

$$I_{C1}' = 2I - I_{C2}' - I_{B1}' - I_{B2}'$$

Substituting for $I_{C1}'$, the above expression becomes:

$$I_{C2}' = \frac{V_A + V_{CE2}'}{V_A + V_{CE1}'} (2I - I_{C2}' - I_{B1}' - I_{B2}')$$

$$\left(1 + \frac{V_A + V_{CE2}'}{V_A + V_{CE1}'}\right) I_{C2}' = \frac{V_A + V_{CE2}'}{V_A + V_{CE1}'} (2I - I_{B1}' - I_{B2}')$$

$$I_{C2}' = \frac{V_A + V_{CE2}'}{2V_A + V_{CE1}' + V_{CE2}'} (2I - I_{B1}' - I_{B2}')$$

$$\therefore I_{C2}' + I_{B2}' = \frac{V_A + V_{CE2}'}{2V_A + V_{CE1}' + V_{CE2}'} (2I - I_{B1}' - I_{B2}') + I_{B2}'$$

By applying the well-known Kirchoff voltage Law to the transistors $Q_1'$ and $Q_2'$, the voltage drops $V_{CE1}'$ and $V_{CE2}'$ can be expressed in terms of $V_{BE}$ and $V_{CC}$, ad substituted into the equation for $I_{C2}'$ to give the following:

$$V_{CE1}' = 2V_{CC} + V_{BE} \qquad V_{CE2}' = V_{BE}$$

$$I_{C2}' + I_{B2}' = \left(\frac{V_A + V_{BE}}{V_A + V_{CC} + V_{BE}}\right) I + I_{B2}' -$$

$$\left(\frac{V_A + V_{BE}}{V_A + V_{CC} + V_{BE}}\right)\left(\frac{I_{B1}' + I_{B2}'}{2}\right)$$

$$\therefore I_0 = I_{C2}' + I_{B2}' \approx I - I_V$$

Figure 5:
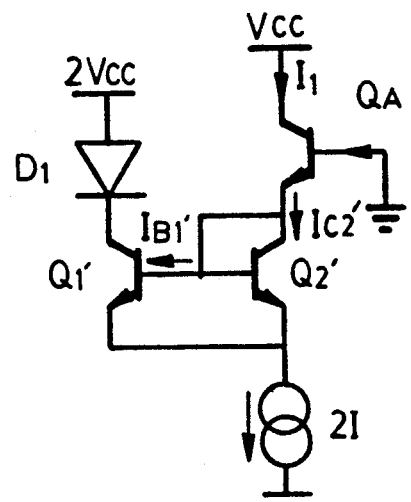
FIG. 5 is a circuit diagram of the determinator of FIG. 4, including a current source.

Referring to FIG. 5, $I_0$, of FIG. 4, may be generated employing $Q_4$. $D_1$ should be added between $2V_{CC}$ and the collector of $Q_1'$ to compensate for $V_{BE4}$.

To generate $I_2$ it is best to use the source $I_1$ of FIG. 2 to avoid glitches when switching off the cross-point 3, although it is not necessary.

Figure 6:
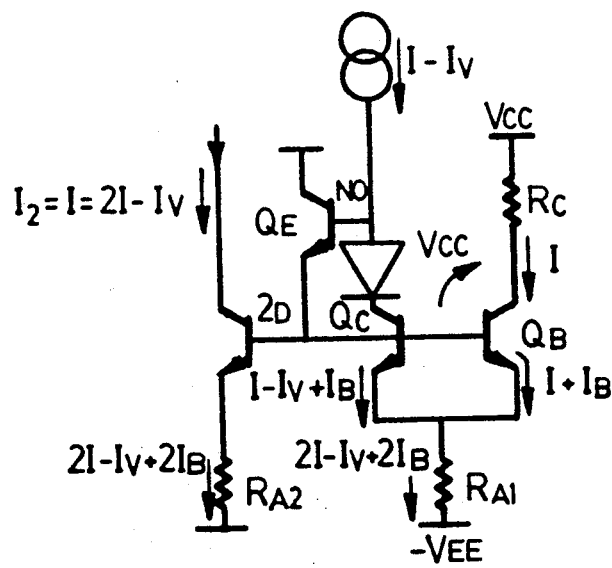
FIG. 6 is a circuit diagram of a current sink.

To generate $I_2$ the circuit shown in FIG. 6 may be used, where $I - I_V$ is drawn from $I_1$. $R_C$ is adjusted so that $V_{CC}$ appears across the collector-base of $Q_B$. Since the $V_{CE}$ of $Q_C$ is $V_{BE}$ and the $V_{CE}$ of $Q_B$ is $V_{CC}$ plus $V_{BE}$, then $I_C$ of $Q_B$ must be I, given that $I_C$ of $Q_C$ is $I - I_V$. $2I - I_V + 2I_B$ will flow through $R_{A1}$. The voltage across $R_{A1}$ will appear across $R_{A2}$ drawing $2I - I_V$ into the collector of $Q_D$.

Figure 7:
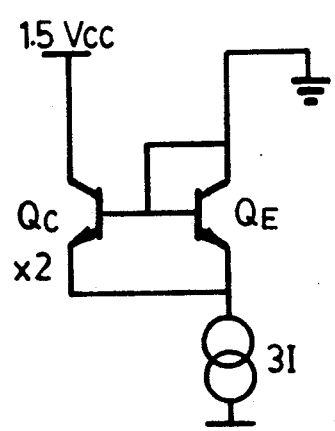
FIG. 7 is a circuit diagram of an equivalent circuit to the determinator of FIG. 4.

Referring to FIGS. 4 and 5, requiring $2V_{CC}$ is undesirable as this would require the use of a second supply. Referring to FIG. 7, the circuit shown will produce approximately the same current as that of FIG. 4. $Q_C$ has twice the emitter area of $Q_E$.

$$I_{CE} \approx \frac{V_A + V_{BE}}{V_A + V_{CC} + V_{BE}} \left(I - \frac{I_{BC}}{3} - \frac{I_{BE}}{3}\right)$$

and $I_{CE} \approx I_{C2}'$

Figure 8:
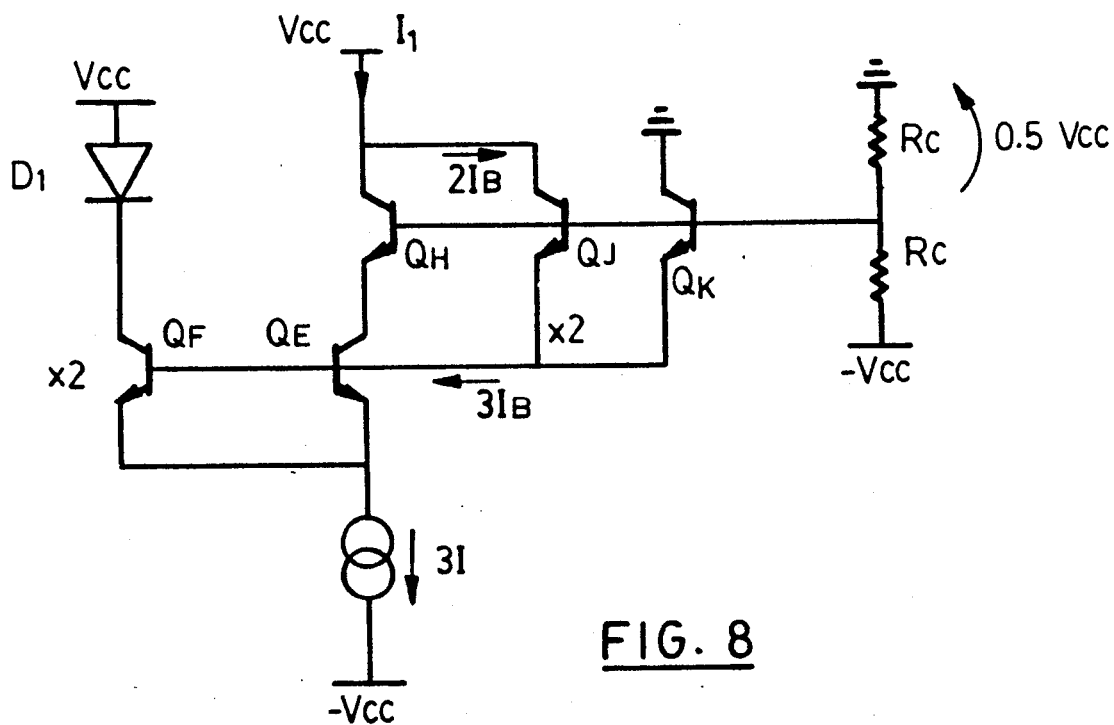
FIG. 8 is a circuit diagram of an equivalent circuit to the determinator of FIG. 5.

The circuit of FIG. 7 can be implemented as shown in FIG. 8. $Q_J$, $Q_K$ provide the base currents for $Q_E$, $Q_F$. $D_1$ compensates for the base-emitter voltages of $Q_H$, $Q_J$, $Q_K$. The voltage divider provided by resistors $R_C$ adds 0.5 $V_{CC}$ voltage drop at the base of $Q_H$. This provides a voltage drop of 1.5 $V_{CC}$ from the collector of $Q_F$ to the collector of $Q_E$. For simplicity we assume $I_B$ = $I_{BE}$ = $I_{BF}/2$. $3I_B$ is required as base current for $Q_E$ and $Q_F$. The collector current of $Q_H$ is $I_{CE} - I_B$. $3I_B$ is divided by $Q_J$ and $Q_K$ and $2I_B$ is added with $I_{CE} - I_B$ so that $I_1 = I_{CE} + I_B$.

Referring to FIG. 3, further approximations have been made as well as adding circuitry to compensate for the base current flowing into $Q_4$. The determinator 29 is substantially equivalent to FIG. 8, except only $V_{CC}$ is between the collectors of $Q_F$ and $Q_E$. $Q_F$, $Q_E$ are replaced by $Q_{11}$, $Q_{12}$. $Q_{11}$ has twice the emitter area of $Q_{12}$. $Q_H$ is replaced by $Q_{10}$. $I_R$ replaces $3I$ and produces $3I$ when switched on. The base of $Q_{10}$ has been tied to ground. The collector of $Q_{11}$ is connected through $Q_9$ and $R_8$ to $V_{CC}$.

$Q_{105}$ and $Q_{106}$ are current mirror configured. $Q_{11}$ and $Q_{12}$ will draw the equivalent of 3 base currents, $3I_B$ through $Q_{13}$. Thus $Q_{105}$ will draw $3I_B$ and $Q_6$ will draw $3I_B$, with $2I_B$ being lost to $Q_{12}$ and $Q_{10}$, for a total of $4I_B$. This current will provide the base current for $Q_4$. To provide sufficient drive capability $Q_4$ is biased with $4I$ externally and has 4 times the emitter area of $Q_1$, $Q_2$ and $Q_3$.

$Q_{10}$, $Q_1$, $Q_{12}$, $Q_{13}$ form the determinator 29. $Q_{11}$ and $Q_{12}$ divide the current from $I_R$ according to $V_A$. $I_1$ is pulled out of the collector of $Q_{101}$ into the determinator 29. As only $V_{CC}$, not 1.5 $V_{CC}$, appears at the collector of $Q_{10}$, $I_1$ does not contain a full $I_V$. This effects the amount of Early voltage compensation for both $Q_2$ and $Q_3$. However, $I_2$ compensates by pulling twice as much less than the difference from a full $I_V$ in $I_1$. This causes a change in the $V_{BE}$ of $Q_1$ which compensates for the effect the difference will have on the $V_{BE}$'s of $Q_1$ and $Q_2$. It also compensates for the effect the difference will have on the $V_{BE}$'s $Q_3$ and $Q_4$. $Q_4$ is operating at approximately the same $V_{CE}$ as $Q_1$. This further compensation is done by biasing the collector-base voltage of $Q_8$ at 1.5$V_{CC}$.

It is not necessary for $Q_{11}$ to be connected through $Q_9$, however this is a convenient means of providing the necessary bias current for $Q_{101}$, $Q_{102}$, and $Q_{103}$ and forms part of the base current compensation of $Q_{101}$, $Q_{102}$, and $Q_{103}$ as will be described later.

$Q_{101}$, $Q_{103}$ and $Q_{102}$ form part of $I_1$ of FIG. 2. They are current mirror connected. The current in the collector of $Q_{101}$ is mirrored in the collectors of $Q_{103}$, $Q_{102}$.

$Q_6$, $Q_5$ and $Q_8$ are also current mirror connected. They, along with $R_6$, $R_5$ and $R_{20}$ form $I_2$ of FIG. 2. $Q_6$ has twice the emitter area of $Q_5$ and $Q_8$.

$I_2$ is equivalent to the circuit shown in FIG. 6, except there is 1.5$V_{CC}$ across $Q_B$ collector-base and there is no base current compensation. $Q_6$, $Q_5$, $Q_8$ are replacements of $Q_D$, $Q_C$, $Q_B$. $R_6$, $R_5$ replace $R_{A2}$, $R_{A1}$. $R_{20}$ replaces $R_B$. The base currents previously provided by $Q_6$ are compensated for in the $4I_B$ component of $I_1$. $I_2$ is drawn from the level shift 25 and the buffer 23, at the emitters of $Q_2$ and $Q_1$. As I minus a fraction of $I_V$ is flowing in the emitter of $Q_2$ then I plus a fraction of $I_V$ flows from the emitter of $Q_1$. Thus the sum of the $V_{BE}$'s of $Q_1$, $Q_2$, $Q_3$, and $Q_4$ are substantially independent of the effect of the Early voltage.

When $I_1$ flows through the level shift 25, it is enabled and $V_{in}$ is connected to $V_{out}$.

FREQUENCY COMPENSATION

Figure 9:
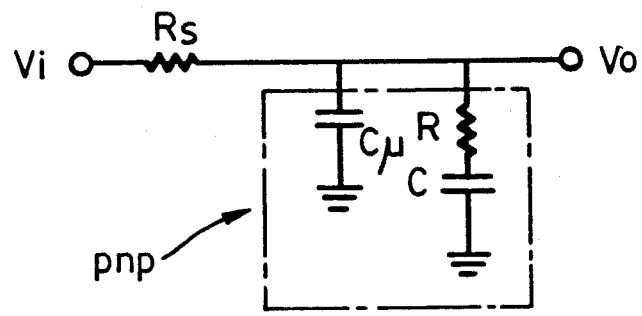
FIG. 9 is a equivalent diagram of an RC network in the switch of FIG. 1.

Frequency compensation is provided by $Q_9$ and $R_8$. As shown in FIG. 9, the resistance $R_S$ of the input buffer 23 plus the level shift 25 and the output impedance of $I_1$ produce an R-C network. As shown in FIG. 9, the resistance R and the capacitance C will tend to shunt the output of $Q_{102}$, and $C_\mu$ is the collector-base capacitance. It is evident that if R is sufficiently low and C is sufficiently high a pole-zero combination will occur within the otherwise usable bandwidth of the switch. The transfer function of the circuit of FIG. 9 is $$\frac{sCR + 1}{s^2 C_\mu CRR_s + sC_\mu R_s + sC(R + R_s) + 1}$$

As R is much greater than $R_s$, the pole and zero combination is caused by the $sCR+1$ and $sC(R+R_s)+1$ terms. This pole-zero causes a dip in the frequency response. To increase the applications for which the switch 1 may be used, it is necessary to bring the pole and zero closer together or shift the pole-zero toward or above the upper limit of the otherwise usable bandwidth of the switch 1.

$$R \text{ is approximately } \frac{R_B + R_E}{R_B} \cdot \frac{1}{2\pi f_T C_\mu}$$

where
  $R_E$ is the equivalent resistance of the emitter to AC ground (in the small signal analysis of bi-polar junction transistors) and,
  $R_B$ is the equivalent resistance of the base to AC ground (in the small signal analysis of bi-polar junction transistors)
  C is approximately
  where $R_e$ is the small signal emitter resistance.

$$\frac{R_B C_\mu}{R_E + r_e}$$

The product RC is approximately $$\left(\frac{R_B + R_E}{r_e + R_E}\right)\left(\frac{1}{2\pi f_T}\right)$$

In order to decrease RC, increase $R_E$ and increase R relative to $R_s$, $R_B$ should be decreased. When the switch 1 is enabled $Q_9$ and $R_8$ provide a low impedance path for high frequencies from the base of $Q_{102}$. This decreases $R_B$, increases $R_E$ and increases R relative to $R_s$ bringing the pole and zero closer together and shifting the pole toward or above the upper limit of the otherwise usable bandwidth. This avoids the necessity of employing a high impedance, high $f_T$ transistor for $Q_{102}$, and the increased expense.

$Q_{104}$ provides DC feedback. Should $I_{E105}$ plus $I_{E106}$ plus $I_{C10}$ be greater than $I_{C101}$ plus $I_{B104}$ an error current will flow into the base of $Q_{104}$. This turns $Q_{104}$ on harder, drawing current from $R_B$ and increasing its voltage drop. This pulls down the base of $Q_9$ and correspondingly, the base of $Q_{101}$. $Q_{101}$ will source more current until $I_{E105}$ plus $I_{E106}$ plus $I_{C10}$ is equal to $I_{C101}$ plus $I_{B104}$. $I_{B104}$ is an unwanted current, but it is kept low given that $R_8$ is sufficiently high.

$C_4$ aids in smoothing transients during enablement of the switch 1. It adds a delay when the voltage at the collector of $Q_{101}$ is pulled down by the determinator 29.

To disable the switch 1, a disable signal is sent to EN. The unit 33 switches off the reference $I_R$. This in-turn shuts off the determinator 29, current sources $I_1$, $I_2$ and disables the level shift 25. $V_{in}$ is isolated from $V_{out}$ by a DC clamp 37 which pulls the base of $Q_4$ down to avoid spurious signals at $V_{out}$.

During the disabling of the switch 1, $R_9$ pulls up the bases of $Q_{103}$, $Q_{102}$, $Q_{103}$ to turn $Q_9$ off. This avoids transistor leakage occurring which may tend to turn $Q_9$ on. As $Q_9$ is an amplifier small leaks could create sufficient current to turn on $Q_{101}$, $Q_{102}$ or $Q_{103}$.

TALLY INDICATION $Q_{113}$ is connected at its base between the collector of $Q_8$ and $R_{20}$. The collector of $Q_{113}$ is connected to TALLY. This provides a tally output signal. When the switch is disabled no current should flow through $I_2$ and $Q_8$ will be off. Similarly $Q_{113}$ will be off and no current will flow with a load connected to TALLY. When the switch 1 is enabled, $Q_8$ should be on and $Q_{113}$ will similarly be on and saturate. The flow of current will indicate the switch is enabled.

As TALLY is taken from the current sink, a component in the biasing network following the cross-point 3, it gives an indication of the operating state of each of the components in the switch. When compared to the signal at EN, TALLY provides a reliable method of trouble shooting circuits not shown, employing the switch 1.

The TALLY could have been taken from other points in the biasing network. However, its location off of $I_2$ provides an indication of the proper functioning of each of $I_2$, $I_1$, the determinator 29, $I_R$, the unit 33, and the steady current generator. Additionally, current is available from $I_2$ without affecting the signal path from $V_{in}$ to $V_{out}$.

It is preferable that TALLY be placed at least in a position where it indicates the operating state of the cross-point 3 through the biasing network.

The switch 1 described herein is a single input to single output switch. The principles described herein would apply equally well to switches which have greater numbers of inputs or outputs. It is to be understood these switches fall within the spirit and scope of the invention.

It will be understood by those skilled in the art that other embodiments of the invention will fall within its spirit and scope as defined by the following claims.

I claim:
1. A switch for switching an input signal at an input to an output signal at an output, said switch being operable in an enabled state and in a disabled state, said switch comprising:
  (a) cross-point switching means for switching the input signal to the output signal;
  (b) switching control means coupled to said cross-point switching means, said switching control means having an enable input for receiving an enable signal and means for switching the input signal to the output signal in response to said enable signal;
  (c) compensation means for controlling an Early voltage effect in said cross-point switching means, said compensation means being coupled to said switching control means;
  (d) said cross-point switching means comprising an output buffer coupled to said input, an output buffer coupled to said output, and level shifting means coupling said input buffer to said output buffer, said level shifting means being coupled to said switching control means, and said level shifting means being responsive to operation of said switching control means for said level shifting means to switch the input signal coupled to said input buffer to said output buffer in response to receipt of said enable signal at said enable input.

2. A switch as claimed in claim 1, wherein said compensation means includes biasing means, said biasing means being coupled to said level shifting means, said biasing means being coupled to said switching control means an being response to said enable signal for enabling said level shifting means to switch the input signal coupled to said input buffer to said output buffer.

3. A switch as claimed in claim 2, wherein said compensation means includes Early voltage determining means and Early voltage compensating means, said determining means and said compensating means being coupled to said level shifting means and to said input buffer.

4. A switch as claimed in claim 3, wherein said input buffer comprises a fist bi-polar junction transistor, and said level shifting mean includes a second bi-polar junction transistor, said first and second bi-polar junction transistor being capable of operating under biasing conditions, nd said Early voltage compensation means includes a bias circuit for setting the biasing conditions of said first and second bi-polar junction transistors, and said Early voltage determining means comprises a direct current circuit, said direct current circuit being coupled to said bias circuit and being substantially equivalent to said first and second bi-polar junction transistor for reproducing the Early voltage effect on said first and second bi-polar junction transistors.

5. A switch as claimed in claim 4, wherein said bias circuit includes a current source coupled to said first and second bi-polar junction transistors, said current source having means for generating a current having first and second current components, said first current component being generated in response to the Early voltage effect in said direct current circuit, and said second current component being generated independent of the Early voltage effect, said current source includes means for supplying said first and second current components to one of said first and second bi-polar junction transistors, so that the Early voltage effect n said first and second bi-polar junction transistors is controlled.

6. A switch as claimed in claim 5, wherein said bias circuit includes a current sink, said current sink being coupled to said first and second bi-polar junction transistors and including means for sinking said first current component being supplied to said second bi-polar junction transistor and for sinking said second current component being supplied to said first bi-polar junction transistor.

7. A switch as claimed in claim 1, wherein said switch has a frequency response range, said frequency response range having a lower frequency and an upper frequency, said switch having a pole and zero combination within said frequency response range, said pole and zero combination being formed from a resistor-capacitor network in said cross-point switching means and said switching control means.

8. A switch as claimed in claim 7, further including frequency response control means for controlling the frequency response to said switch, said frequency compensation means being coupled to said switching control means.

9. A switch as claimed in claim 8, wherein said frequency compensation means includes means or shifting the pole and zero combination towards the upper frequency of said frequency response range.

10. A switch as claimed in claim 8, wherein said frequency compensation means includes means or bringing the pole closer to the zero.

11. A switch as claimed in claim 8, wherein said frequency compensation means includes means for shifting the pole and zero combination beyond the upper frequency of said frequency response range.

12. A switch as claimed in claim 17, wherein said frequency compensation means comprises a current source, said current source being coupled to a bi-polar junction transistor and a resistor said resistor having an adjustable resistance value and including means for setting said resistance value.

13. A switch as claimed in claim 1, further including switch state indicating means for indicating when said switch is in the enabled state and when said switch is in the disabled state, said switch indicting means being coupled to said compensation means.

14. A switch for switching an input signal to an output signal, said switch being operable over a frequency response range and said switch having an enabled state and a disabled state, said switch comprising:
 (a) cross-point switching means for switching the input signal to the output signal;
 (b) switching control means coupled to said cross-point switching means, said switching control means having an enable input for receiving an enable signal and means for switching the input signal to the output signal in response to said enable signal;
 (c) compensation means or controlling an Early voltage effect in said cross-point switching means, said compensation means being coupled to said switching control means;
 (d) switch state indicating means for indicating when said switch is in the enabled state and when said switch is in the disabled state said switch state indicating means being coupled to said compensation means; and
 (e) frequency response control means for controlling the frequency response of said switch, said frequency response control means being coupled to said switching control means.

* * * * *